(12) United States Patent
Eleftheriou et al.

(10) Patent No.: US 9,576,655 B2
(45) Date of Patent: *Feb. 21, 2017

(54) APPARATUS AND METHOD FOR PROGRAMMING A MULTI-LEVEL PHASE CHANGE MEMORY (PCM) CELL BASED ON AN ACTUAL RESISTANCE VALUE AND A REFERENCE RESISTANCE VALUE

(71) Applicant: HGST NETHERLANDS BV, Amsterdam (NL)

(72) Inventors: Evangelos S. Eleftheriou, Rueschlikon (CH); Angeliki Pantazi, Rueschlikon (CH); Nikolaos Papandreou, Rueschlikon (CH); Haris Pozidis, Rueschlikon (CH); Abu Sebastian, Rueschlikon (CH)

(73) Assignee: HGST NETHERLANDS B.V., Amsterdam (NL)

( * ) Notice: Subject to any disclaimer, the term of this patent is extended or adjusted under 35 U.S.C. 154(b) by 338 days.

This patent is subject to a terminal disclaimer.

(21) Appl. No.: 13/659,364

(22) Filed: Oct. 24, 2012

(65) Prior Publication Data
US 2013/0044540 A1 Feb. 21, 2013

Related U.S. Application Data

(63) Continuation of application No. 13/638,311, filed as application No. PCT/IB2011/051220 on Mar. 23, 2011, now Pat. No. 9,064,571.

(30) Foreign Application Priority Data

Mar. 30, 2010 (EP) ..................................... 10158300

(51) Int. Cl.
*G11C 13/00* (2006.01)
*G11C 11/56* (2006.01)

(52) U.S. Cl.
CPC ...... *G11C 13/0069* (2013.01); *G11C 11/5678* (2013.01); *G11C 13/0004* (2013.01); *G11C 2013/0078* (2013.01)

(58) Field of Classification Search
CPC ............ G11C 13/0069; G11C 13/0004; G11C 13/0011; G11C 2013/0071;
(Continued)

(56) References Cited

U.S. PATENT DOCUMENTS 7,486,536 B2 * 2/2009 Kim et al. .................... 365/148
7,663,132 B2 * 2/2010 Toda et al. ....................... 257/3
(Continued)

FOREIGN PATENT DOCUMENTS

CN 101140800 A 3/2008
EP 1 865 512 A2 6/2007
(Continued)

OTHER PUBLICATIONS

International Search Report, PCT/IB2011/051220, mailed Jul. 27, 2011.
(Continued)

*Primary Examiner* — Andrew Q Tran
(74) *Attorney, Agent, or Firm* — Oblon, McClelland, Maier & Neustadt, L.L.P.

(57) ABSTRACT

An apparatus for programming at least one multi-level Phase Change Memory (PCM) cell having a first terminal and a second terminal. A programmable control device controls the PCM cell to have a respective cell state by applying at least one current pulse to the PCM cell, the control device controlling the at least one current pulse by applying a respective first pulse to the first terminal and a respective second pulse applied to the second terminal of the PCM cell. The respective cell state is defined by a respective resistance level. The control device receives a reference resistance
(Continued)

value defining a target resistance level for the cell, and further receives an actual resistance value of said PCM cell such that the applying the respective first pulse and said respective second pulse is based on said actual resistance value of the PCM cell and said received reference resistance value.

12 Claims, 12 Drawing Sheets

(58) Field of Classification Search
CPC .... G11C 2013/0076; G11C 2013/0092; G11C 2213/79
USPC ................ 365/148, 158, 163, 189.16, 210.1
See application file for complete search history.

(56) References Cited

U.S. PATENT DOCUMENTS

| 8,116,127 | B2* | 2/2012 | Cho et al. .................... 365/163 |
| 9,064,571 | B2* | 6/2015 | Eleftheriou et al. | |

| 2007/0008769 | A1 | 1/2007 | Kim et al. |
| 2008/0002457 | A1 | 1/2008 | Toda et al. |
| 2008/0025080 | A1 | 1/2008 | Chan et al. |
| 2008/0117667 | A1 | 5/2008 | Nirschl et al. |
| 2009/0080242 | A1 | 3/2009 | Resta et al. |

FOREIGN PATENT DOCUMENTS

| JP | 2007-335068 A | 12/2007 |
| JP | 2009-099199 A | 5/2009 |
| JP | 2009-146480 A | 7/2009 |

OTHER PUBLICATIONS

Official Action dated Oct. 17, 2013, received from the UK Patent Office, GB1218792.8.
Letter from IBM Japan which indicates that the date of the issued Office Action is May 7, 2014.
Notice of Allowance dated Feb. 17, 2015, received in a related U.S. Appl. No. 13/638,311.

* cited by examiner

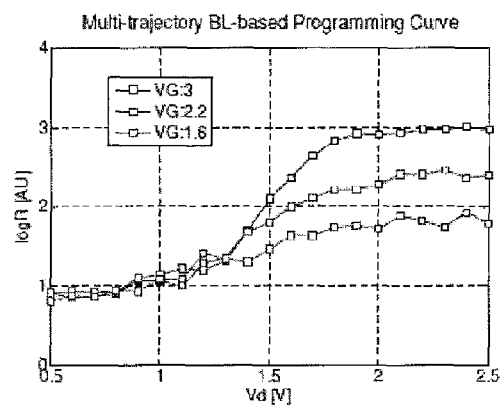
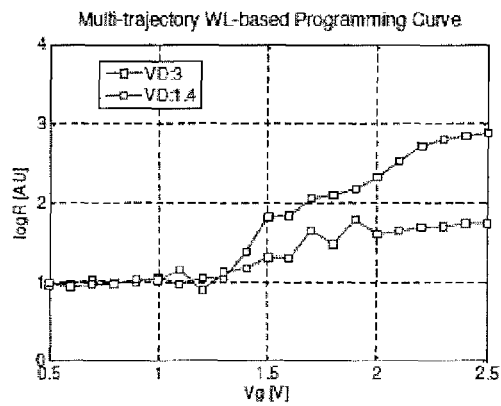
Fig. 8
Fig. 9
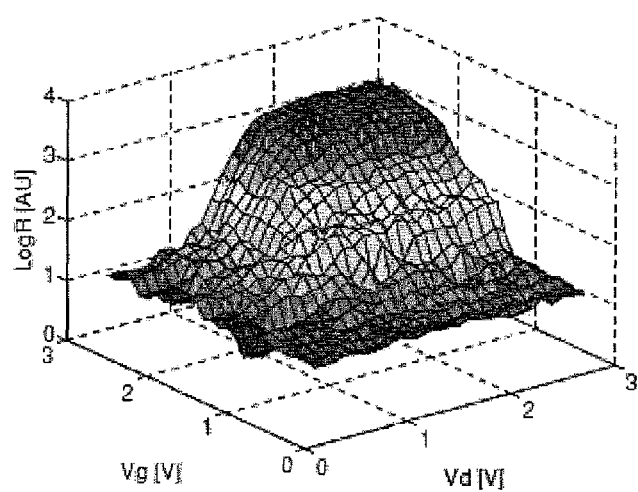
Fig. 10

APPARATUS AND METHOD FOR PROGRAMMING A MULTI-LEVEL PHASE CHANGE MEMORY (PCM) CELL BASED ON AN ACTUAL RESISTANCE VALUE AND A REFERENCE RESISTANCE VALUE

CROSS-REFERENCE TO RELATED APPLICATIONS

The present application is a continuation application of and claims the benefit of the filing date of U.S. patent application Ser. No. 13/638,311, filed on Sep. 28, 2012.

BACKGROUND

The present disclosure relates to a method and to a device for programming at least one multi-level Phase Change Memory (PCM).

Phase change memory (PCM) is a non-volatile solid-state memory technology that exploits the reversible, thermally-assisted switching of specific chalcogenides between certain states of different electrical conductivity.

PCM is a promising and advanced emerging non-volatile memory technology mainly due to its excellent features including low latency, high endurance, long retention and high scalability. PCM may be considered a prime candidate for Flash replacement, embedded/hybrid memory and storage-class memory. Key requirements for competitiveness of PCM technology may be multi-level cell functionality, in particular for low cost per bit, and high-speed read/write operations, in particular for high bandwidth. Multilevel functionality, i.e. multiple bits per PCM cell, may be a way to increase capacity and thereby to reduce cost.

Multi-level PCM is based on storing multiple resistance levels between a lowest (SET) and a highest (RESET) resistance value. Multiple resistance levels or levels correspond to partial-amorphous and partial-crystalline phase distributions of the PCM cell. Phase transformation, i.e. memory programming, may be enabled by Joule heating. In this regard, Joule heating may be controlled by a programming current or voltage pulse. Storing multiple resistance levels in a PCM cell is a challenging task. Issues like process variability, as well as intra-cell and inter-cell material parameter variations may give rise to deviations of the achieved resistance levels from their intended values. One way to resolve this issue may be to resort to iterative programming schemes, in particular with multiple write-verify steps until a desired resistance level is reached.

In general, any iterative scheme aims to efficiently control the programming current through the cell in order to converge to the desired resistance level.

Several solutions have been proposed for multi-level PCM [1] and [2]. In [1], a programming scheme is presented that applies write pulses with amplitudes that are incrementally increased to approach the target resistance. In [2], a method is described that starts in the SET state, i.e. in the fully crystalline mode, and applies melting pulses to gradually amorphize the PCM cell.

When an access device, such as a field effect transistor (FET), is used to select a PCM cell in a cell-array, current control and iterative programming as such are achieved either by proper adjustment of the wordline (WL) voltage or the bitline (BL) voltage. In current memory architectures, WL-based programming is not preferred when it concerns high-bandwidth implementations. On the other hand, a main drawback of BL-based programming is that the current window, and equivalently the corresponding voltage window, for full-scale programming strongly depends on the threshold voltage barrier, especially when programming from a high to a low resistance state.

In the presence of cell variability, conventional WL-based programming and BL-based programming need a plurality of iterations to program cells in multiple states.

SUMMARY OF THE INVENTION

According to an embodiment of a first aspect of the invention, a method for programming at least one multi-level Phase Change Memory (PCM) cell is provided. The PCM cell may be controllable by a first terminal, in particular coupled to a bitline, and a second terminal, in particular coupled to a wordline. The method comprises the following steps:
programming the PCM cell to have a respective definite cell state by at least one current pulse flowing to the PCM cell, said respective definite cell state being defined at least by a respective definite resistance level,
controlling said respective current pulse by a respective first pulse applied to the first terminal and a respective second pulse applied to the second terminal, and
controlling said respective first pulse and said respective second pulse dependent on an actual resistance value of the PCM cell and a respective reference resistance value being defined for the definite resistance level.

In particular, an iterative programming scheme is used for programming said at least one multi-level PCM cell. The iterative programming scheme may use multiple write-verify steps for programming a respective definite resistance level of the PCM cell.

The first pulse may be a bitline pulse. The bitline pulse may be applied at the bitline. Further, the second pulse may be a wordline pulse. The wordline pulse may be applied at the wordline.

The definite cell state of the PCM cell may also be denoted as target cell state being defined at least by a respective definite resistance level of the PCM cell, also denoted as target resistance level of the PCM cell.

According to an embodiment of a second aspect, the invention relates to a computer program comprising a program code for executing the method for programming at least one multi-level Phase Change Memory (PCM) cell when run on a computer.

According to an embodiment of a third aspect of the invention, a device for programming at least one multi-level Phase Change Memory (PCM) cell being controllable by a first terminal, in particular coupled to a bitline, and a second terminal, in particular coupled to a wordline, is suggested. The device comprises controlling means for controlling a first pulse applied to the first terminal and a second pulse applied to the second terminal dependent on an actual resistance value of the PCM cell and a reference resistance value being defined for a definite resistance level of the PCM cell, said first pulse and said second pulse being adapted to control at least one current pulse flowing to the PCM cell for programming the PCM cell to have a respective definite cell state, the respective definite cell state being defined at least by the respective definite resistance level.

The programmed resistance level of the respective PCM cell is dependent on the applied first pulse, e.g. a bitline pulse, and the applied second pulse, e.g. a wordline pulse. Thus, a space provided by the wordline pulse and the bitline pulse may determine a programming surface for programming the PCM cell.

In a case that the access device or access entity for controlling the current through the phase change element of the PCM cell is an FET, the wordline pulse may be a gate voltage (VG) and the bitline pulse may be a drain voltage (VD). Then, the programming surface may be a VG-VD-space.

As embodiments of the present invention may provide an optimum control of the bitline pulse and the wordline pulse for programming the multi-level PCM cell, embodiments of the invention may provide an optimum control of the programming surface. The provided optimum control of the programming surface according to embodiments of the invention causes a minimum number of necessary iterations for programming the multi-level PCM cell when applying iterative programming schemes. Thus, embodiments of the present invention may provide a fast convergence if a respective definite resistance level is programmed.

Furthermore, embodiments of the present invention may provide an enhanced programming voltage/current resolution. This aspect may be of high importance when the threshold voltage of the access device is high. Further, this aspect may provide a benefit for fixed-point implementations. Moreover, a better control under noise and cell variability may be provided.

Further, the combined wordline-bitline programming may provide the ability of a linearization of programming regimes that display non-linear behaviour. This may provide fast convergence, enhanced level locations and less noise sensitivity.

Because embodiments of the present invention may utilize programming from the SET-side and from the RESET-side, the present scheme may be used for bi-directional programming In this regard, partial-amorphous regimes may be used.

In one embodiment of the method of the present invention, said step of controlling the current pulse is started with an initial couple of a bitline pulse and a wordline pulse, said initial couple being derived from average programming curves provided in dependence on a plurality of PCM cells.

In a further embodiment, said wordline pulse is a wordline voltage pulse applied to a control terminal of an access entity for controlling an access to the PCM cell. Moreover, said bitline pulse may be a bitline voltage or current pulse applied to the bitline. Said PCM cell may be coupled between said bitline and said access entity. Said wordline voltage pulse and said bitline voltage or current pulse may be controlled by a difference value of the actual resistance value and the reference resistance value.

Particularly, the access entity may be a field effect transistor (FET). In this regard, the wordline voltage pulse may be a gate voltage (VG) applied at the gate of the FET. Further, the bitline voltage pulse may be a drain voltage (VD) applied at the drain of the FET.

In a further embodiment, the method comprises the steps:
dividing at least a part of a resistance window between a lowest and a highest resistance value of the PCM cell into a plurality of distinct resistance ranges,
respectively associating the distinct resistance ranges with a different programming trajectory, said different programming trajectories being respectively defined by a different wordline pulse,
mapping a respective definite resistance level to one of the distinct resistance ranges, the mapped distinct resistance range having an associated programming trajectory, and
applying iterative programming in order to achieve the respective definite resistance level using bitline pulses and their programming trajectory associated to the resistance range mapped to the respective definite resistance level.

Further, in the case of an FET as an access entity for accessing the PCM cell, the above may be described as follows: A number of different reference gate voltages may be used to effectively enable multi-trajectory programming curves. The target resistance window of the PCM cell may be divided into distinct ranges or regimes that may be served by different programming trajectories, i.e. different gate voltages. Further, each target level may be mapped to one of the different programming regimes, i.e. the different gate voltages. Lastly, iterative programming may be applied based on bitline pulses of particularly varying amplitude and a fixed gate voltage based on the level allocation.

Thus, parallel bitline-based programming may be enabled which causes the ability of a full parallelization with a higher-level data management.

The above described bitline-based programming scheme may combine high-performance multi-level storage along with high-bandwidth multi-cell programming The above scheme may be based on an iterative write-and-verify scheme which may use an adaptive current control algorithm and may exploit a multi-level and multi-trajectory programming concept in order to enhance the resolution of the adaptive algorithm.

In a further embodiment, a full-scale resistance window between the lowest and the highest resistance value of the PCM cell is divided into the plurality of distinct resistance ranges.

The gap between the lowest (SET) and the highest (RESET) resistance value of the PCM cell may define the full-scale resistance window and, therefore, the maximum resistance window for programming the PCM cell.

In a further embodiment, the respective resistance range is associated with the programming trajectory of the programming trajectories covering the respective definite resistance level which has the maximum resolution. In particular, the respective resistance range may be associated with the programming trajectory which is adapted to increase a linearity and/or a width of the programming voltage or current window.

In a further embodiment, the respective programming trajectory is associated with a respective maximum resistance value. As a result, the maximum current of the respective programming pulse flowing to the PCM cell is limited. The limited current of the respective programming pulse flowing to the PCM cell avoids any overshooting advantageously when the PCM cell is programmed using the respective programming trajectory.

In a further embodiment, said iterative programming is applied in order to achieve the respective definite resistance level using bitline pulses of varying amplitude and using the programming trajectory associated to the resistance range mapped to the respective definite resistance level.

In a further embodiment, the method comprises a step of programming the respective PCM cell to have a respective definite cell state by a number of different current or voltage pulses flowing to the PCM cell, said respective definite cell state being defined by at least a number of different definite resistance levels.

In one embodiment of the device of the present invention, the device has measuring means for measuring the actual resistance value of the PCM cell and for providing the measured actual resistance value to said controlling means.

In a further embodiment, said controlling means comprises dividing means and associating means. In this regard, said dividing means may be adapted to divide at least a part of a resistance window between a lowest and a highest resistance value of the PCM cell into a plurality of distinct resistance ranges. Furthermore, said associating means may be adapted to respectively associate the distinct resistance ranges with a different programming trajectory. The different programming trajectories may be respectively defined by a different wordline pulse. Further, said mapping means may be adapted to map a respective definite resistance level to one of the distinct resistance ranges. The mapped resistance range may have an associated programming trajectory.

In a further embodiment, the device further has bitline pulse generating means and selecting means. The bitline pulse generating means or bitline pulse generator may be adapted to provide bitline pulses to the PCM cell in dependence on a first control signal. Moreover, said selecting means may be adapted to select a wordline pulse of a number of defined wordline pulses in dependence on a second control signal. In this regard, said controlling means may be adapted to provide the first control signal and the second control signal in dependence on the reference resistance value being defined for the definite resistance value and the actual resistance value.

In a further embodiment, said selecting means may be adapted to change the initially selected wordline pulse in order to adapt to the PCM cell characteristics during an iterative programming The respective means, e.g. said controlling means, may be implemented in hardware or in software. If said means are implemented in hardware, it may be embodied as a device, e.g. as a computer or as a processor, or as a part of a system, e.g. a computer-system. If said means are implemented in software, it may be embodied as a computer program product, as a function, as a routine, as a program code or as an executable object.

In the following, exemplary embodiments of the present invention are described with reference to the enclosed figures.

BRIEF DESCRIPTION OF THE FIGURES

FIG. 8 shows an exemplary diagram of a multi-trajectory bitline-based programming curve of a PCM cell;

FIG. 9 shows an exemplary diagram of a multi-trajectory wordline-based programming curve of a PCM cell;

FIG. 10 shows an exemplary diagram of a programming surface for programming a PCM cell;

Like or functionally alike elements in the figures have been allocated the same reference signs if not otherwise indicated.

DETAILED DESCRIPTION OF PREFERRED EMBODIMENTS

Embodiments of the present invention may be applied to multi-level Phase Change Memory (PCM) cells. Multi-level functionality, i.e. multiple bits per PCM cell, is a prominent way to increase the capacity and thereby to reduce costs. A multi-level PCM cell is based on storing multiple resistance levels between a lowest (SET) and a highest (RESET) resistance value. The multiple levels or multiple resistance levels of the PCM cell correspond to partial-amorphous (partial-RESET) and partial-crystalline (partial-SET) phase distributions. The phase change, i.e. the state programming, may be enabled by Joule heating, in particular by temperature or current control, and may be initiated electrically, in particular by a threshold switching mechanism (e.g. see FIG. 2).

Figure 1:
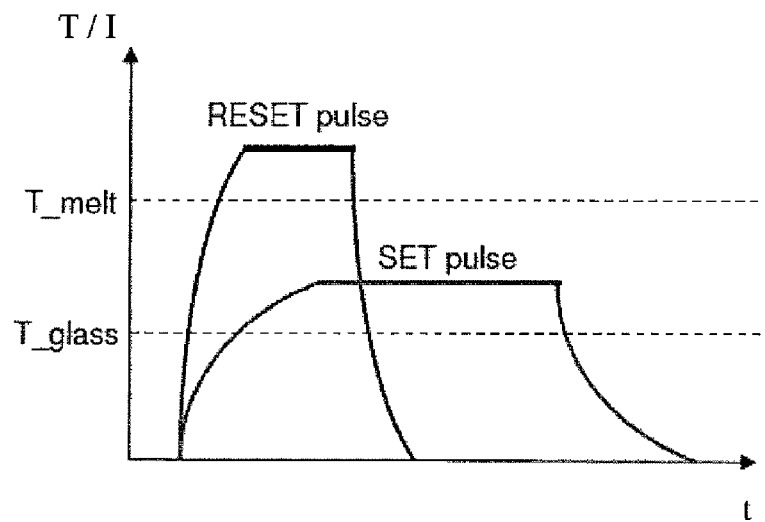
FIG. 1 shows a diagram illustrating a RESET pulse and a SET pulse for programming a PCM cell.

In this regard, FIG. 1 shows a diagram illustrating a RESET pulse and a SET pulse for programming a PCM cell. The x-axis of diagram of FIG. 1 shows the time t and the y-axis shows the temperature T and the current I. The RESET pulse is shorter than the SET pulse, but it has a higher current amplitude. Further, the RESET pulse lies over the melting temperature T_melt. In contrast, the SET pulse lies between the melting temperature T_melt and the glass temperature T_glass.

Figure 2:
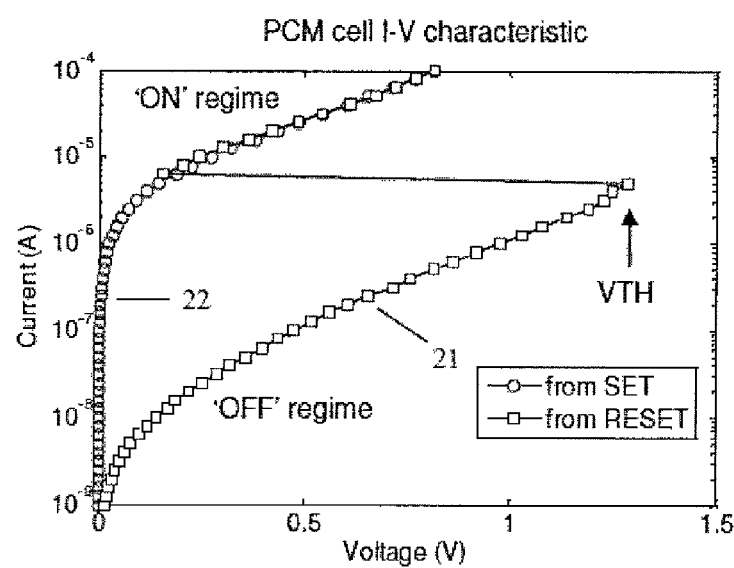
FIG. 2 shows an I-V characteristic of a PCM cell.

Furthermore, FIG. 2 shows an I-V characteristic of a PCM cell. Here, curve 21 is generated beginning from RESET. In contrast, curve 22 is generated beginning from SET. The threshold voltage VTH of a PCM cell demarcates the transition to the dynamic "ON" regime, where programming takes place, while the "OFF" regime is used for reading the state of the PCM cell, in principle, at low voltages.

Figure 3:
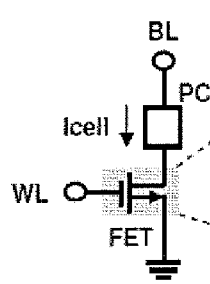
FIG. 3 shows an example of a wordline-based current control of a PCM cell.
Figure 3:
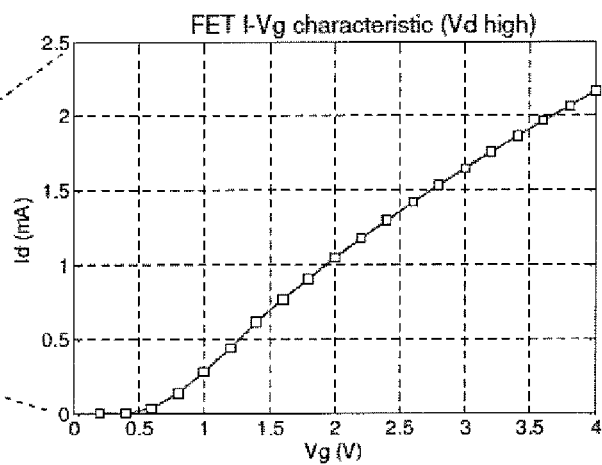
Figure 4:
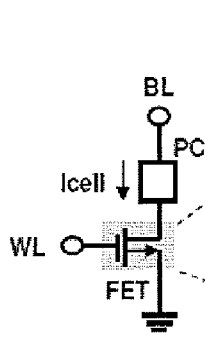
FIG. 4 shows an example of a bitline-based current control of a PCM cell.
Figure 4:
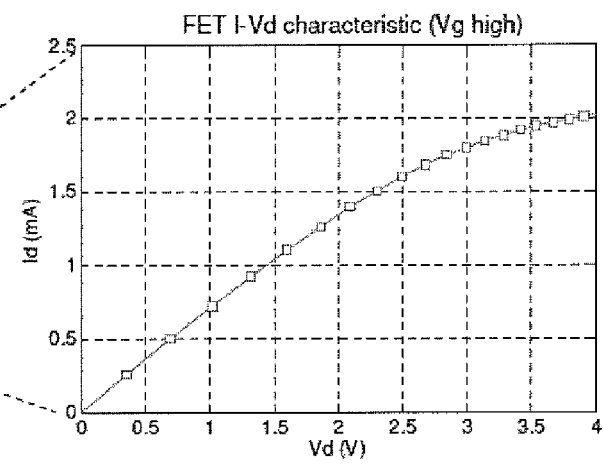

For differentiating two different modes of the current control for programming a PCM cell, FIG. 3 shows an example of a wordline-based current control of a PCM cell, and FIG. 4 illustrates an example of a bitline-based current control of a PCM cell.

In this regard, the left parts of FIG. 3 and FIG. 4 respectively show a circuitry having a phase change element PCE and a field effect transistor FET as an access entity. Further, terminals to the bitline BL and to the wordline WL are shown. Furthermore, the right part of FIG. 3 shows an I-VG characteristic of the field effect transistor FET having a constant high VD. In an analogous way, the right part of FIG. 4 shows an I-VD characteristic of the FET having a constant high VG.

With respect to FIG. 3, the field effect transistor FET may be used as a current source. A high voltage VD, the drain voltage, may be applied across the bitline BL. The current Icell may be controlled by means of the gate voltage VG applied to the wordline WL.

With respect to FIG. 4, the field effect transistor FET may be used as a switch. In contrast to FIG. 3, a high voltage VG is applied at the wordline WL. The current Icell may be controlled by the drain voltage VD applied to the bitline BL.

Figure 5:
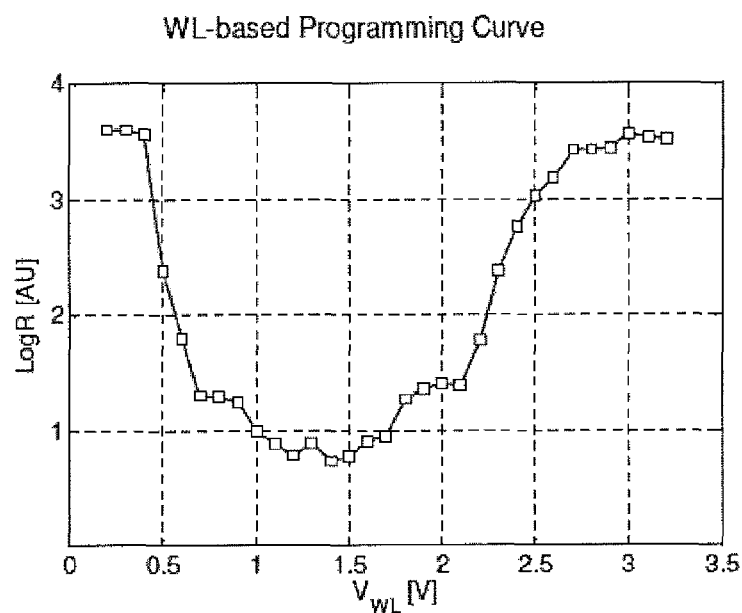
FIG. 5 shows an exemplary diagram of a wordline-based programming curve of a PCM cell.
Figure 6:
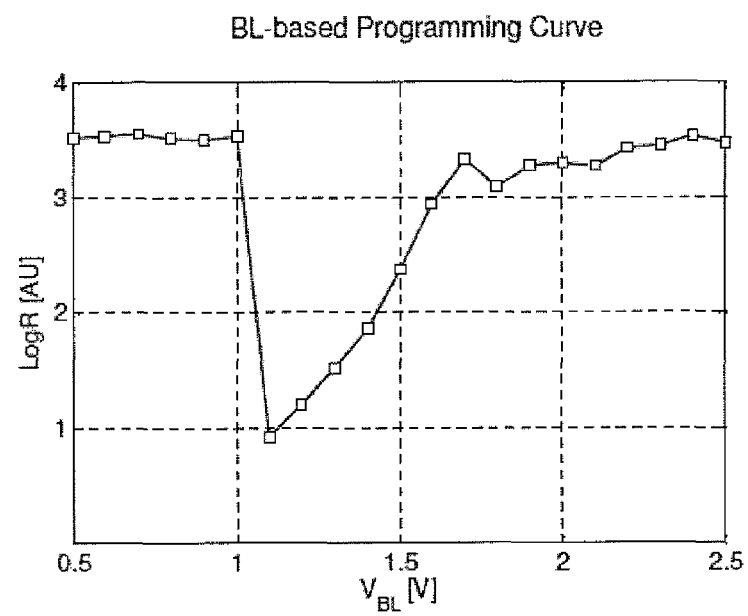
FIG. 6 shows an exemplary diagram of a bitline-based programming curve of a PCM cell.

Further, for differentiating wordline-based programming and bitline-based programming, FIGS. 5 and 6 show an exemplary diagram of a wordline-based programming curve and a bitline-based programming curve of a PCM cell, respectively, starting from RESET.

A comparison of FIGS. 5 and 6 shows that the wordline-based programming curve of FIG. 5 has a left programming slope and a right programming slope, wherein the bitline-based programming curve of FIG. 6 has only a right programming slope. Thus, an advantage of the wordline-based programming curve of FIG. 5 is that it is U-shaped and therefore has the two programming regimes, namely the left slope and the right slope. In contrast, the bitline-based programming curve of FIG. 6 has only one programming regime, namely the right slope.

Figure 7:
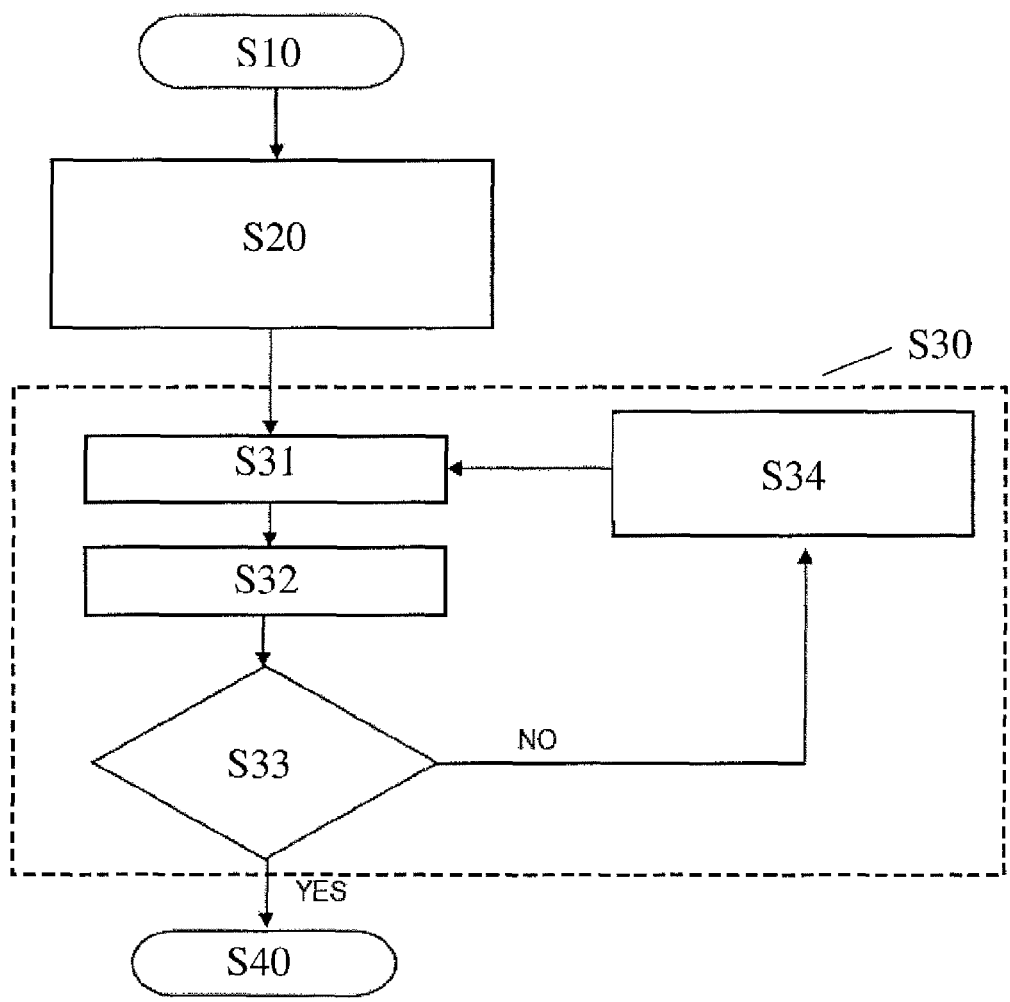
FIG. 7 shows an embodiment of a sequence of method steps for programming at least one multi-level PCM cell.

FIG. 7 shows an embodiment of method steps for programming at least one multi-level PCM cell, the PCM cell being controllable by a bitline and a wordline.

The method of FIG. 7 has the steps S10-S40:

In step S10, the method of FIG. 7 is started.

In step S20, at least one respective definite resistance level or target resistance level is loaded. Together with the target resistance level, further parameters may be loaded. Said further parameters include an initial couple of a wordline pulse and a bitline pulse for starting the iterative programming step S30, a respective error margin for the respective target resistance level and controller gains. The initial couple of the wordline pulse and the bitline pulse may be derived from average programming curves. The average programming curves may be provided in dependence on a plurality of PCM cells.

The iterative programming step S30 includes the method steps S31-S34. In the step S31, the PCM cell is programmed. The PCM cell is programmed to have a respective definite cell state. In particular, the PCM cell is programmed by at least one current pulse flowing to the PCM cell. The respective definite cell state may be defined by at least the respective definite resistance level or target definite resistance level. For the first time that step S31 may be applied for a respective PCM cell, the initial couple of the wordline pulse and the bitline pulse is used as provided by step S20.

In step S32, an actual resistance value of the respective PCM cell is measured and read.

In step S33, it is determined if the read actual resistance level is within the error margin as provided in step S20. If the read actual resistance value lies within said error margin, the present method continues with step S40. If not, the present method continues with step S34.

In step S34, a new respective current pulse for programming the PCM cell is provided. This respective current pulse is controlled by a respective bitline pulse and a respective wordline pulse. Further, the respective bitline pulse and the respective wordline pulse are controlled in dependence on the read actual resistance value of the PCM cell as provided by step S33 and a respective reference resistance value being defined for the target resistance level.

In step S40, the present method is terminated.

FIG. 8 shows an exemplary diagram of bitline-based programming curves of a PCM cell with different constant gate voltages. For comparison issues, FIG. 9 shows an exemplary diagram of wordline-based programming curves of a PCM cell with different constant drain voltages. In both diagrams the PCM cell is starting from SET.

With respect to FIG. 8, the programming trajectory 81 has a fixed gate voltage VG of 3.0V (VG=3.0V). Further, the programming trajectories 82 and 83 of FIG. 8 have fixed gate voltages VG of 2.2V and 1.6V, respectively.

In an analogous way, with respect to FIG. 9, the programming trajectory 91 has a fixed drain voltage VD of 3.0 V (VD=3.0V). Further, the programming trajectory 92 of FIG. 9 has a fixed drain voltage VD of 1.4 V (VD=1.4V).

Further, with respect to the programming trajectories 81-83 and 91, 92 of FIGS. 8 and 9, it may be derived that multiple trajectories exist for a target resistance level.

In the light of FIGS. 8 and 9, it may be derived that a VG-VD programming space may determine a programming surface for programming a PCM cell. In this regard, FIG. 10 shows an exemplary diagram of such a programming surface for programming a PCM cell. FIG. 10 clearly shows that there are two degrees of freedom, namely a wordline pulse, e.g. VG, and a bitline pulse, e.g. VD, for programming a PCM cell. As a result, the respective current pulse for programming the PCM cell may be controlled by a couple of a bitline pulse and a wordline pulse.

Figure 11:
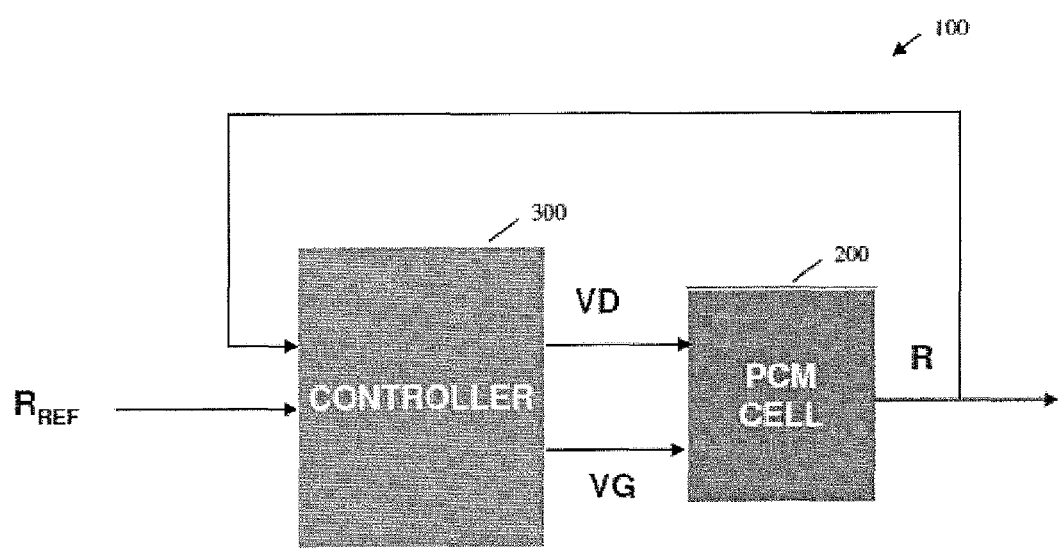
FIG. 11 shows a block diagram of a first embodiment of a device for programming at least one multi-level PCM cell.

FIG. 11 shows a block diagram of an embodiment of a device 100 for programming at least one multi-level PCM cell 200 comprising a phase change element and a corresponding access device, e.g. an FET.

The device 100 comprises controlling means 300. Said controlling means 300 may be embodied as a single-input multiple-output entity, receiving a reference resistance value Rref and outputting a drain voltage VD as a bitline pulse and a gate voltage VG as a wordline pulse.

Said controlling means 300 may be adapted to control the bitline pulse VD and the wordline pulse VG dependent on an actual resistance value R of the PCM cell 200 and the reference resistance value Rref. The reference resistance value Rref may be defined for the definite resistance level or target resistance level of the PCM cell 200.

Said bitline pulse VD and said wordline pulse VG provided by said controlling means 300 may be adapted to control at least one current pulse applied to the phase change element of the PCM cell 200 for programming the PCM cell to have a respective definite cell state. The respective definite cell state may be defined at least by the respective definite resistance level or target resistance level.

For controlling the bitline pulse VD and the wordline pulse VG, said controlling means 300 may comprise feed-forward control entities and feed-back control entities.

Figure 12:
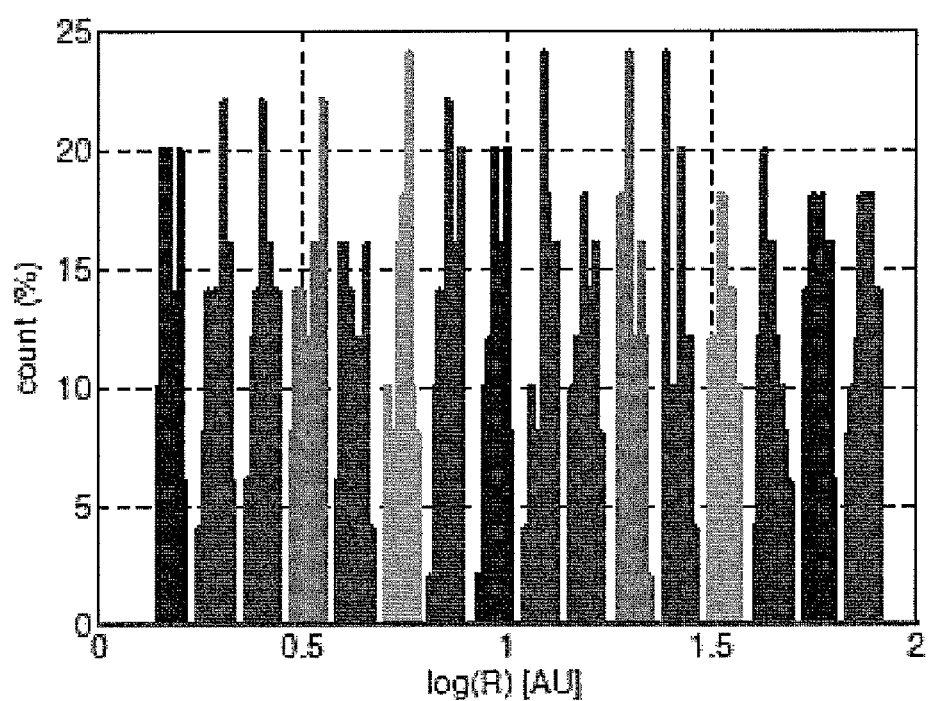
FIG. 12 shows a diagram illustrating experimental results of an embodiment of the present invention.

In this regard, FIG. 12 shows a diagram illustrating experimental results of an embodiment of the present invention. According to this embodiment, the used PCM cell is programmed to 16 distinct resistance levels within a range of two orders in magnitude in order to store four bits of information.

Figure 13:
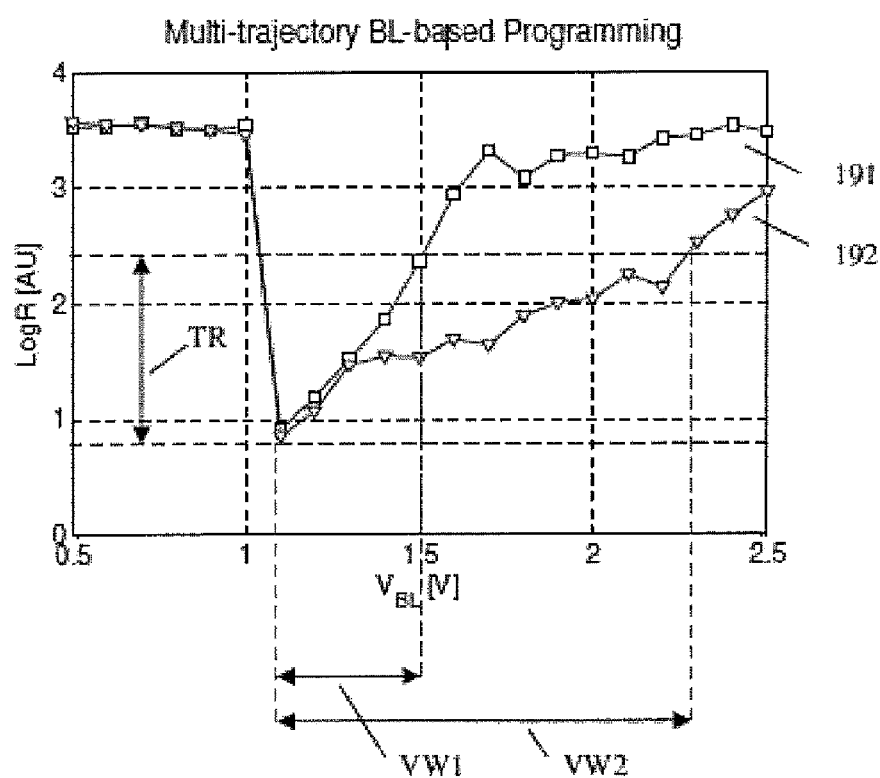
FIG. 13 shows an exemplary diagram of two bitline-based programming curves illustrating different voltage windows for programming the PCM cell.
Figure 14:
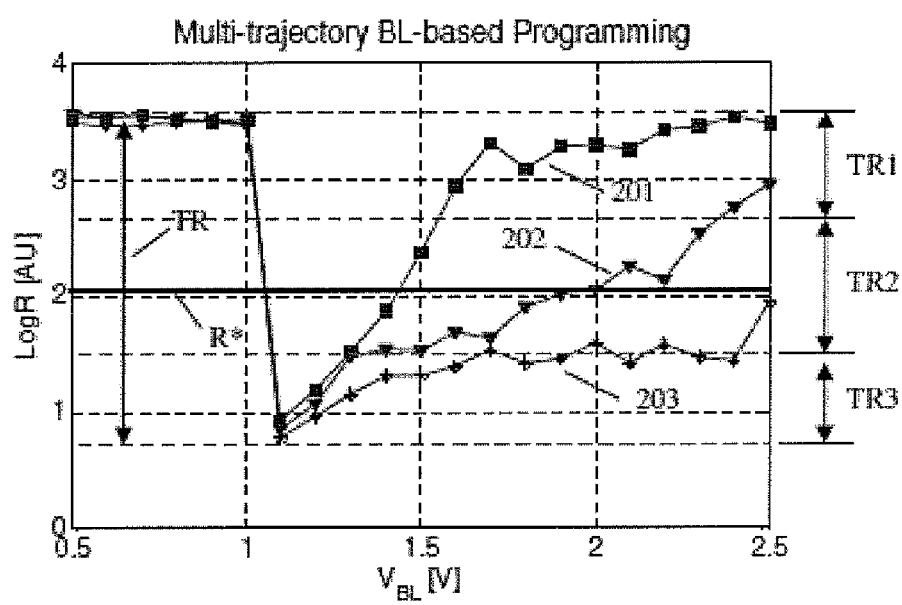
FIG. 14 shows an exemplary diagram of three bitline-based programming curves for programming the PCM cell.

In more detail, FIG. 13 shows an exemplary diagram of two bitline-based programming curves 191 and 192 illustrating different voltage windows VW1 and VW2 for programming the PCM cell. The programming curve 191 corresponds to a higher VG value. Therefore, the voltage window VW1 is narrower than the voltage window VW2 of the programming curve 192. In other words, for the same target resistance range—in FIG. 13 indicated with the reference sign TR—the programming trajectory 192 having a lower VG provides a larger voltage window VW2 (VW2>VW1). The wider voltage window VW2 may provide a higher resolution and a better control for iterative multi-level programming FIG. 14 shows an exemplary diagram of three bitline-based programming curves 201, 202, 203 for programming a PCM cell. With reference to said FIG. 14, an embodiment of the present invention may be described: In a first step, a target resistance range TR lying between a lowest and a highest resistance value of the PCM cell may be divided into a plurality of distinct resistance ranges TR1, TR2 and TR3.

The distinct resistance ranges TR1-TR3 are respectively associated with different programming trajectories 201-203. In the example of FIG. 13, the distinct resistance range TR1 may be associated to the programming trajectory 201. Further, the distinct resistance range TR2 may be associated to the programming trajectory 202. Furthermore, the distinct resistance range TR3 may be associated to the programming trajectory 203. The different programming trajectories 201-203 may be respectively defined by a different wordline pulse. Further, a respective definite resistance level, e.g. R*, may be mapped to one of the distinct resistance ranges TR1-TR3. In the present example of FIG. 14, the resistance level R* may be mapped to the programming trajectory 202. Further, iterative programming may be applied to achieve the respective definite resistance level, e.g. R*, using bitline pulses of varying amplitude and the programming trajectory associated to the resistance range mapped to the respective definite resistance level, here the programming trajectory 202.

In particular, the target resistance range TR may be a full-scale resistance window between the lowest and the highest resistance value of the PCM cell.

In particular, the respective resistance range TR1-TR3 may be associated with the programming trajectory 201-203 covering the respective definite resistance level and having a maximum resolution of the programming trajectories 201-203 covering the respective definite resistance level. In the example of FIG. 14, the programming trajectory 202 may be the optimum one for programming a resistance level R*.

Figure 15:
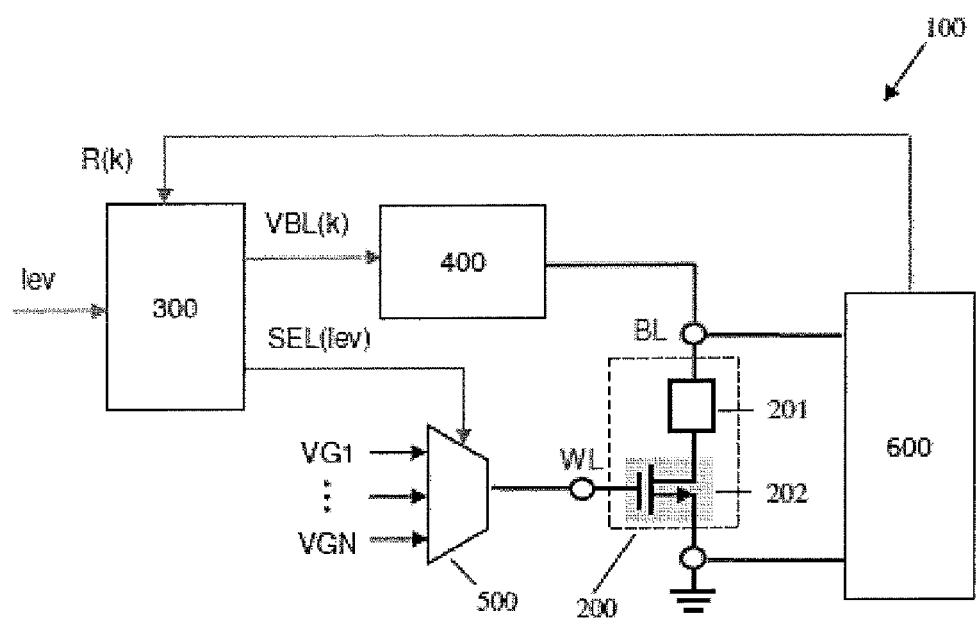
FIG. 15 shows a block diagram of a second embodiment of the device for programming at least one multi-level PCM cell.

FIG. 15 shows a block diagram of a second embodiment of the device 100 for programming at least one multi-level PCM cell 200. The PCM cell 200 may comprise a phase change element 201 and an FET 202. The device 100 may comprise a controller 300. Said controller may be embodied as the controlling means of FIG. 11.

The device 100 of FIG. 15 provides bitline-based programming using fixed gate voltages VG1-VGN at the gate of the FET 202.

Further, the controller 300 receives a control signal lev indicating a definite resistance level and the actual resistance value R(k) of the PCM cell 200. Dependent on the signals lev and R(k), the controller 300 provides a first control signal VBL(k) and SEL(lev).

Further, the device 100 has a bitline pulse generator 400. The bitline pulse generator 400 may be adapted to provide bitline pulses to the PCM cell 200 in dependence on said first control signal VBL(k). Further, device 100 may have selecting means 500. Said selecting means 500 may receive said fixed gate voltages VG1 and VGN. In dependence on the received second control signal SEL(lev), said selection means 500 may provide one of the received gate voltages VG1-VGN to the wordline WL coupled to the FET 202 of the PCM cell 200. Said selecting means 500 may change during the iterative programming the initially selected gate voltage in order to adapt to the PCM cell characteristics if necessary. Further, said device 100 may have measuring means 600 for measuring the actual resistance value R(k) of the PCM cell 200 and for providing the method actual resistance value R(k) to said controller 300.

Figure 16:
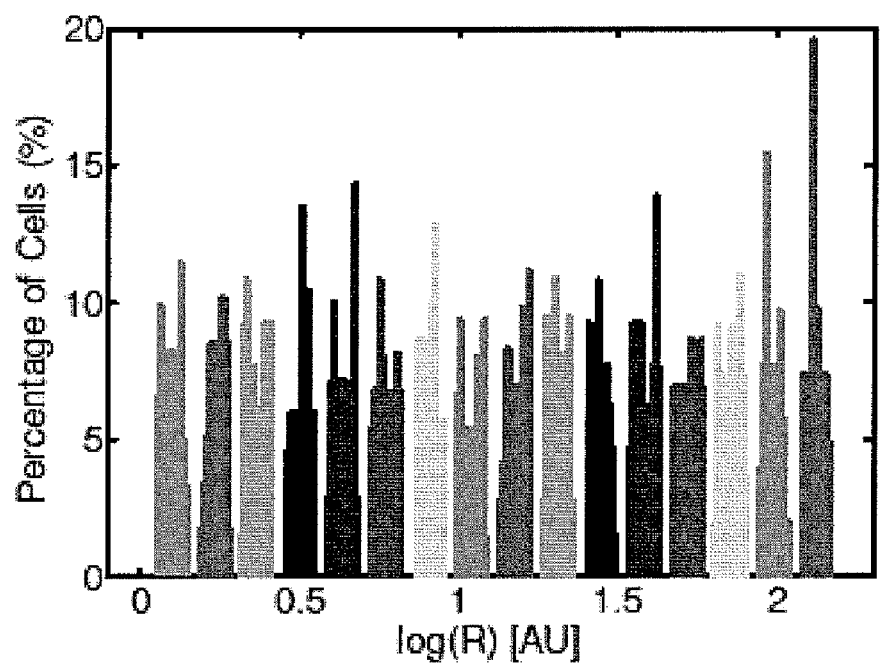
FIG. 16 shows a diagram illustrating experimental results of an embodiment of the present invention for programming an array of PCM cells.

FIG. 16 shows a diagram illustrating experimental results of an embodiment of the present invention. According to this embodiment, a PCM cell array is programmed to 16 distinct resistance levels in a range of almost two orders in magnitude in order to store four bits of information.

Figure 17:
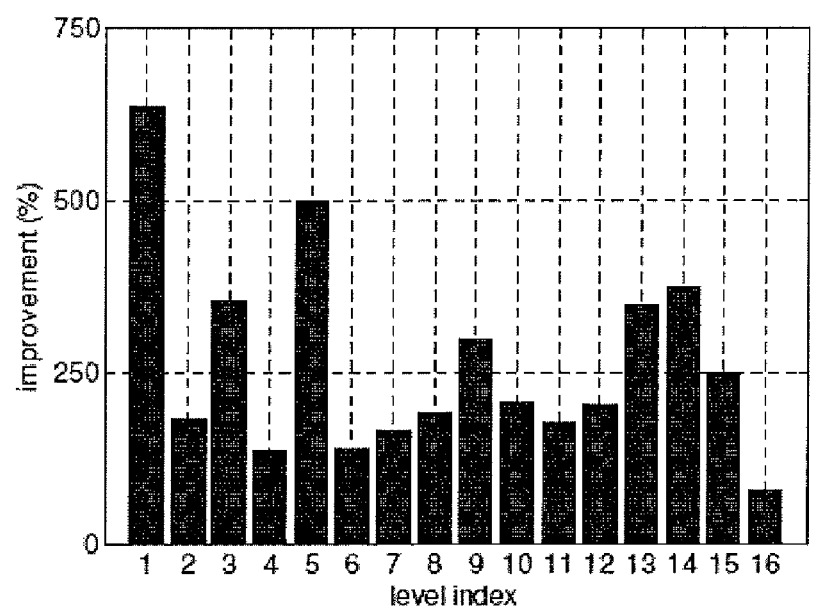
FIG. 17 shows a diagram illustrating an improvement of speed of convergence of an embodiment of the method of the present invention compared to a conventional method.

FIG. 17 shows a diagram illustrating an improvement of speed of convergence of an embodiment of the method of the present invention compared to a conventional method. In detail, FIG. 17 illustrates the improvement, in %, of the speed of convergence, i.e. the reduction of the average number of iterations of the present method using multiple VG's compared with the conventional method applying a single VG. The results of FIG. 17 correspond to a single cell programmed in 16 levels.

All above mentioned embodiments of the method of the present invention may be embodied by respective means to be a respective embodiment of the device for programming at least one multi-level PCM cell above mentioned third aspect of the invention present invention.

What has been described herein is merely illustrative of the application of the principles of the present invention. Other arrangements and systems may be implemented by those skilled in the art without departing from the scope and spirit of this invention.

REFERENCES

[1] Bedeschi et al, "A Bipolar-Selected Phase Change Memory Featuring Multi-Level Cell Storage", IEEE Journal of Solid-State Circuits, vol. 44, no. 1, January 2009.
[2] J.-B. Philipp and T. Happ, "Semiconductor device including multi -bit memory cells and a temperature budget sensor", see also US 2008/0084738 A1.

The invention claimed is:

1. An apparatus for programming at least one multi-level Phase Change Memory (PCM) cell having a first terminal and a second terminal, the apparatus comprising:
   a measuring device;
   a bitline pulse generator;
   a selector device; and
   a programmable controller configured to control the PCM cell to have a cell state by applying a first voltage pulse to the first terminal of the PCM cell and applying a second voltage pulse to the second terminal of the PCM cell, said cell state being defined at least by a corresponding resistance level, wherein
   said programmable controller receives a signal representing a reference resistance value defining a target resistance level for said PCM cell, and receives a further signal representing an actual resistance value of said PCM cell,
   said applying said first voltage pulse and applying said second voltage pulse is based on said actual resistance value of the PCM cell and said received reference resistance value,
   said programmable controller is configured to generate an initial pair of first and second voltage pulses, the first voltage pulse including a bitline voltage pulse for application to the first terminal and the second voltage pulse including a wordline voltage pulse for application to the second terminal,
   said measuring device configured to measure the actual resistance value of the PCM cell, and provide the measured actual resistance value to said programmable controller,
   said PCM cell includes an access entity configured to control an access to the PCM cell, said programmable controller applying said wordline voltage pulse to a control terminal of said access entity and applying said bitline voltage pulse to a bitline, said PCM cell being coupled between said bitline and said access entity, said wordline voltage pulse and said bitline voltage pulse are controlled by a difference value of the actual resistance value and the reference resistance value, said programmable controller is configured to
- divide at least a part of a resistance window between a lowest and a highest resistance value of the PCM cell into a plurality of distinct resistance ranges,
- respectively associate the distinct resistance ranges with a programming trajectory, said programming trajectories being respectively defined by the wordline voltage pulse or the bitline voltage pulse,
- map a respective definite resistance level to one of the distinct resistance ranges, the mapped distinct resistance range having an associated programming trajectory,
- apply iterative programming on the PCM cell in order to achieve the respective definite resistance level using the bitline voltage pulses or wordline voltage pulses and the programming trajectory associated to the mapped distinct resistance range, and
- generate a first control signal and a second control signal based on said actual resistance value of the PCM cell and said received reference resistance value defined for the target resistance level, said bitline pulse generator is configured to provide the bitline voltage pulses to the PCM cell in dependence on said first control signal, and said selector device is configured to select the wordline voltage pulse from a number of defined wordline voltage pulses in dependence on said second control signal.

2. The apparatus of claim 1, wherein said selector device is adapted to change an initially selected wordline voltage pulse to adapt to the PCM cell characteristics during the iterative programming.

3. The apparatus of claim 1, wherein the resistance window between a lowest and a highest resistance value is a full-scale resistance window between the lowest and the highest resistance value of the PCM cell.

4. The apparatus of claim 1, wherein the mapped distinct resistance range having a maximum resolution of the programming trajectories, wherein the programming trajectory is adapted to increase a linearity or a width of a programmed voltage or a current window.

5. The apparatus of claim 1, wherein the programming trajectory is associated with a maximum programming current which is associated with a maximum resistance value for limiting the maximum programming current flowing through the PCM cell.

6. The apparatus of claim 1, wherein said iterative programming is applied on the PCM cell in order to achieve the target resistance level using the bitline voltage pulses or wordline voltage pulses of varying amplitude and the programming trajectory associated to the distinct resistance range on which the target resistance level is mapped.

7. The apparatus of claim 1, wherein said programmable controller programs the PCM cell to have said cell state by a number of different current pulses flowing through the PCM cell.

8. A computer program product for programming at least one multi-level Phase Change Memory (PCM) cell having a first terminal and a second terminal, the computer program product comprising a tangible, non-transitory, storage medium readable by a processing circuit and storing instructions run by the processing circuit for performing a method, the method comprising:
- programming, by the processing circuit, the PCM cell to have a cell state, said cell state being defined at least by a target resistance level, said programming comprising:
  - controlling, using said processing circuit, an application of a first voltage pulse to the first terminal of the PCM cell; and
  - controlling, using said processing circuit, an application of a second voltage pulse to the second terminal of the PCM cell,
- said controlling, by the processing circuit, including controlling said first voltage pulse and controlling said second voltage pulse dependent on an actual resistance value of the PCM cell and a reference resistance value defined for the target resistance level, wherein said controlling comprising:
  - generating an initial pair of said first and second voltage pulses, the first voltage pulse including a bitline voltage pulse for application to the first terminal and the second voltage pulse including a wordline voltage pulse for application to the second terminal;
- measuring the actual resistance value of the PCM cell, and providing the measured actual resistance value to the processing circuit, said PCM cell including an access entity configured to control an access to the PCM cell;
- applying said wordline voltage pulse to a control terminal of said access entity and applying said bitline voltage pulse to a bitline, said PCM cell being coupled between said bitline and said access entity, said wordline voltage pulse and said bitline voltage pulse are controlled by a difference value of the actual resistance value and the reference resistance value;
- dividing at least a part of a resistance window between a lowest and a highest resistance value of the PCM cell into a plurality of distinct resistance ranges;
- associating respectively, the distinct resistance ranges with a programming trajectory, said programming trajectories being respectively defined by the wordline voltage pulse or the bitline voltage pulse;
- mapping a respective definite resistance level to one of the distinct resistance ranges, the mapped distinct resistance range having an associated programming trajectory;
- applying iterative programming on the PCM cell in order to achieve the respective definite resistance level using the bitline voltage pulses or wordline voltage pulses and the programming trajectory associated to the mapped distinct resistance range;
- generating a first control signal and a second control signal based on said actual resistance value of the PCM cell and said received reference resistance value defined for the target resistance level;
- providing the bitline voltage pulses to the PCM cell in dependence on said first control signal; and
- selecting the wordline voltage pulse from a number of defined wordline voltage pulses in dependence on said second control signal.

9. The computer program product of claim 8, wherein a full-scale resistance window between the lowest and the highest resistance value of the PCM cell is divided into the plurality of distinct resistance ranges.

10. The computer program product of claim 8, wherein the mapped distinct resistance range having a maximum resolution of the programming trajectories wherein the programming trajectory is adapted to increase a linearity or a width of a programmed voltage or a current window.

11. The computer program product of claim 8, wherein the programming trajectory is associated with a maximum programming current which is associated with a maximum resistance value for limiting the maximum programming current flowing through the PCM cell.

12. The computer program product of claim 8, wherein said method further comprises: applying iterative programming on the PCM cell, to achieve the target resistance level using the bitline voltage pulses or wordline voltage pulses of varying amplitude and the programming trajectory associated to the distinct resistance range on which the target resistance level is mapped.

* * * * *